(12) United States Patent
Bolotnikov et al.

(10) Patent No.: US 7,758,843 B1
(45) Date of Patent: Jul. 20, 2010

(54) INCLUSION FREE CADMIUM ZINC TELLURIUM AND CADMIUM TELLURIUM CRYSTALS AND ASSOCIATED GROWTH METHOD

(75) Inventors: Aleskey E. Bolotnikov, South Setauket, NY (US); Ralph B. James, Ridge, NY (US)

(73) Assignee: U.S. Department of Energy, Washington, DC (US)

( * ) Notice: Subject to any disclaimer, the term of this patent is extended or adjusted under 35 U.S.C. 154(b) by 0 days.

(21) Appl. No.: 12/416,224

(22) Filed: Apr. 1, 2009

(51) Int. Cl.
*C01B 19/00* (2006.01)
*C01B 19/04* (2006.01)

(52) U.S. Cl. .............. 423/508; 423/509; 252/62.3 ZT; 252/62.3 V; 977/813; 977/824

(58) Field of Classification Search ............... 423/508, 423/509; 252/62.3 ZT, 62.3 V; 977/813, 977/824
See application file for complete search history.

(56) References Cited

U.S. PATENT DOCUMENTS

| | | | |
|---|---|---|---|
| 4,732,110 A * | 3/1988 | Parsons | ..................... 118/719 |
| 5,306,660 A | 4/1994 | Younger | |
| 5,838,053 A | 11/1998 | Bevan | |
| 5,933,706 A | 8/1999 | James | |
| 5,989,933 A | 11/1999 | Bevan | |
| 2004/0175939 A1 * | 9/2004 | Nakamura et al. | .......... 438/689 |

FOREIGN PATENT DOCUMENTS

WO    WO 03/029516 A1 * 4/2003

OTHER PUBLICATIONS

J. T. Mullins et al. "Crystal growth of large-diameter bulk CdTe on GaAs wafer seed plates" Journal of Crystal Growth, vol. 310, Issues 7-9, pp. 2058-2061, Apr. 2008.*

R.T.Lynch, Vapor growth of cadmium telluride crystals, J. Appl. Phys., 33, pp. 1009-1011, 1962.
Liu Hongtao, Purification of CdZnTe by physical vapor transport method, Materials Letters, 59, pp. 3837-3840, 2005.
Samantha Hawkins, Light induced tellurium enrichment on CdZnTe, J.Elect. Materials, 2008 vol. 37 Issue 9 pp. 1438-1443.
Hermon, Analysis of CZT crystals and Detectors, J. Electronic Materials, vol. 28, Issue 6, pp. 688-694 1999.
R. Grill, Dynamics of Point Defects in Te-enriched CdTE, submitted to IEEE, 2006.
C. Li, Thermophysical properties of liquid Te, J. Appl. Phys V.97, p. 083513, 2005.
Yeckel, Buoyant and rotational flows in small scale verticle Bridgeman growth of CdZnTe, J. Crystal Growth, 233, 599, 2001.
Yi He, Improved growth of PbI2 single crystals, J.Crys. Growth, V. 33, Issue 2, pp. 448-451, 2007.
Bhavsar, Cryst. Res. Technol. 37(23) 2002.
Carini, Effects of Te precipitates on performance of CdZnTe detectors, Appl Phys Lett, vol. 88 pp. 143515, 2006.

* cited by examiner

*Primary Examiner*—Timothy C Vanoy
(74) *Attorney, Agent, or Firm*—Joy Alwan; Brian J. Lally

(57) ABSTRACT

The present disclosure provides systems and methods for crystal growth of cadmium zinc tellurium (CZT) and cadmium tellurium (CdTe) crystals with an inverted growth reactor chamber. The inverted growth reactor chamber enables growth of single, large, high purity CZT and CdTe crystals that can be used, for example, in X-ray and gamma detection, substrates for infrared detectors, or the like. The inverted growth reactor chamber enables reductions in the presence of Te inclusions, which are recognized as an important limiting factor in using CZT or CdTe as radiation detectors. The inverted growth reactor chamber can be utilized with existing crystal growth techniques such as the Bridgman crystal growth mechanism and the like. In an exemplary embodiment, the inverted growth reactor chamber is a U-shaped ampoule.

18 Claims, 7 Drawing Sheets

INCLUSION FREE CADMIUM ZINC TELLURIUM AND CADMIUM TELLURIUM CRYSTALS AND ASSOCIATED GROWTH METHOD

CONTRACTUAL ORIGIN OF THE INVENTION

The U.S. Government has rights in this invention pursuant to Contract Number DE-ACO2-98CH10886 between the Government and Brookhaven Associates representing Brookhaven National Laboratory.

FIELD OF THE INVENTION

The present invention relates generally to crystal growth for radiation detection, substrates for mercury-cadmium-telluride infrared detectors, and the like. More particularly, the present invention provides systems and methods for crystal growth with an inverted growth reactor chamber for cadmium zinc tellurium (CZT) and cadmium tellurium (CdTe) crystals.

BACKGROUND OF THE INVENTION

Conventionally, cadmium zinc tellurium (CZT) and cadmium tellurium (CdTe) crystals can be used to detect the presence of radiation at room temperature. CZT and CdTe crystals accomplish this by directly converting X-ray or y-ray photons into electrons and holes. These electrons and holes are influenced by the application of an applied bias voltage and generate an electric current, which can be measured and recorded. CZT and CdTe crystals are unique semiconductors, because they operate at room temperature and can process up to about 10 million photons/second/mm$^2$. Thus, CZT and CdTe are promising room-temperature nuclear radiation detector materials. For many years, CZT single crystals have captured significant interest due to their wide band gap energy, large atomic number, high resistivity, excellent transport properties for electrons, and good chemical stability. These properties make it suitable for production of room-temperature X-ray and y-ray detectors and imaging arrays.

CdTe and CZT crystals are conventionally grown by melting CdTe and CZT and allowing the melt to crystallize. Traveling heater, horizontal Bridgman, vertical Bridgman, and high pressure Bridgman methods have been conventionally used to grow CdTe and CZT crystals from the melt or from the vapor phase. In the past, crystals grown by such processes tend to suffer from high cost and small crystal size. In addition, the crystals produced by these melt and vapor phase processes tend to have poor electrical and physical characteristics that greatly limit their sensitivity and application as economical radiation detectors. There is a long felt need for a technique for growing high purity, low-cost single CdTe and CZT crystals of a size suitable for high sensitivity detection at high resolution.

CZT single crystals can now be grown up to hundreds of cubic centimeters. Several types of device configurations that rely only on the transport of electrons have been proposed to fully utilize all the advantages of such large-volume CZT crystals. However, big CZT detectors have not achieved their anticipated performance, because the energy resolution was found to degrade with device thickness, particularly for long-drift-length devices (e.g., >5-10 mm). The typical energy resolution measured for 10-15-mm thick detectors is 3-5% on average and ~2% for the best devices. One of the reasons for this degradation is the effects caused by tellurium (Te) inclusions in the bulk of the crystals. For example, the presence of these inclusions can be revealed by using infrared (IR) transmission microscopy or high spatial resolution X-ray mapping techniques.

Large crystals are more likely to absorb stray gamma rays or x-rays created by radioactive decays leading to an electronic signal upon absorption. A disadvantage of large crystals is that they usually contain more defects that degrade the material properties and reduce the quality of the signal. One of the most common defects in CZT and CdTe crystals are tellurium inclusions. As background, the term "inclusion" is generally used to describe any volume of material trapped inside a crystal during its formation. Typical inclusions can be 1-30 micro m in diameter, are faceted in many cases, can possess voids within their volumes, and have been identified as containing primarily solid tellurium. For example, FIG. 1 illustrates Te inclusions (with average diameter of ~30 micro m) seen as dark spots in an IR image taken for a typical CZT sample.

It is well known that CZT (and CdTe) crystals melt congruently at about 1100° C., and they do not undergo a transition phase from the melting point down to room temperature. Thus CZT single crystals can be grown by melt methods, such as the High-Pressure Bridgman (HPB), Vertical Bridgman, Horizontal Bridgman (VBHM), Traveling Heater (TH), and Zone Melting Methods (ZMM). Some difficult growth problems have been encountered in the quest to produce large uniform CZT single crystals suitable for high-efficiency, gamma-ray detectors. The most pressing problems are associated with decomposition of the melt during the crystal growth process, preferential cadmium (Cd) evaporation, and deposition of segregated Te leading to the formation of Te inclusions. These problems are ultimately limiting the performance of today's thick (>~5 mm) commercial CZT detectors.

Tellurium inclusions are usually formed during the solidification of the crystal. When growing CZT single crystals by the typical melt methods, there is always surplus space in the upper section of the ampoule (also referred to as a reaction chamber) above the melt. In the CZT crystal growth process, cadmium evaporates from the melt and exists in the form of vapor within the upper surplus space of the growth ampoule. The evaporation and subsequent condensation of cadmium disturbs the stoichiometric composition of the CZT melt, causing the melt to become increasingly tellurium rich. Since the vapor pressure of tellurium is much lower than that of cadmium, the effects of tellurium vapor in the gas and of elemental cadmium in the melt can be ignored (i.e., for stoichiometric starting materials). This tellurium-rich melt is the ultimate cause of the Te inclusions present in CZT detectors produced by conventional commercial processes; consequently, growers must effectively control the composition of the melt to produce high-quality, inclusion-free crystals. Post-growth thermal annealing in a Cd overpressure is helpful to reduce the size of the Te inclusions in the as-grown crystals, but the residual damage caused by the Te-rich inclusions remains after thermal annealing.

While Te inclusions are found throughout the crystal volume, higher concentrations are observed near grain and twinning boundaries of crystals. FIGS. 2(a)-2(d) illustrate infrared (IR) images of Te inclusions showing the shapes of typical Te inclusions in different orientations and structures. For example, using Miller indice notation, the various images include FIG. 2(a) (112), FIG. 2(b) (111), FIG. 2(c) twin between (115) and (111), FIG. 2(d) decoration of a mini-mosaic structure. The density of CZT Te inclusions in the current CZT crystals is about $10^5$ cm$^{-3}$. They are dispersed throughout the crystals and often form meandering and straight "trails", most likely following regions of high dislocations. Tellurium inclusions act like a short circuit path that degrades the material and disrupts the electrical signal. Te inclusions can be detected using IR transmission microscopy or high spatial resolution x-ray mapping techniques. For example, FIG. 3 illustrates the correlation between Te inclusions as identified by dark spots in an IR image and degraded zones displaying poor charge collection as seen in the X-ray map. The X-ray scan area is ~1.2×1.2 mm$^2$, the beam size is 10×10 µm$^2$, and the step size is 10 µm.

In practically all cases, a traditional Bridgman growth method is used conventionally to grow CZT and CdTe detectors. The presence of inclusions was not previously recognized as an important limiting factor in crystal functionality. Only recently has it been determined that that inclusions were the major cause limiting the device performance for thick gamma ray and x-ray CZT detectors. G. A. Carini, A. E. Bolotnikov, G. S. Camarda, G. W. Wright, and R. B. James, "Effect of Te-precipitates on performance of CdZnTe detectors", Appl Phys Lett, Vol. 88, pp. 143515, 2006. In fact, tellurium inclusions were long presumed to be benign in terms of device quality. Given the new knowledge, there is a recognized need to reduce the size and density of tellurium inclusions, or eliminate them altogether.

One possible way to eliminate the formation of Te inclusions is by increasing the stirring of the melt through accelerated-decelerated rotation of the furnace. Although doable, this is an extraordinarily difficult approach that has been modeled, but not yet attempted for CZT and CdTe crystal growth. The presence of inclusions at the surface of CZT infrared substrates seriously disrupts growth of the mercury cadmium telluride epi-layer and performance of the IR imaging arrays. Hence a simple yet elegant approach is needed to eliminate the formation of Te inclusions during crystal growth.

BRIEF SUMMARY OF THE INVENTION

In various exemplary embodiments, the present invention provides systems and methods for crystal growth of cadmium zinc tellurium (CZT) and cadmium tellurium (CdTe) crystals with an inverted growth reactor chamber. The inverted growth reactor chamber enables growth of single, large, high purity CZT or CdTe crystals that can be used, for example, in radiation detection or the like. Advantageously, the inverted growth reactor chamber enables reduction in the presence of Te inclusions, which are now recognized as an important limiting factor in using CZT or CdTe as radiation detectors. The inverted growth reactor chamber can be utilized with existing crystal growth techniques such as the Bridgman crystal growth mechanism and the like. In an exemplary embodiment, the inverted growth reactor chamber includes a U-shaped ampoule.

In an exemplary embodiment, a method for growing one of Cadmium Telluride (CdTe) and Cadmium Zinc Telluride (CZT) crystal includes providing a inverted growth reactor chamber for growing one of CZT and CdTe crystals; preparing the inverted growth reactor chamber for growing one of the CZT and CdTe crystals; heating the inverted growth reactor chamber; and cooling the inverted growth reactor chamber thereby growing one of the CZT and CdTe crystals. The inverted growth reactor chamber can include a first elongated section; a second elongated section with a seed pocket for one of CZT and CdTe seed crystals; and a common section between the first elongated section and the second elongated section with one of molten CZT and molten CdTe. Optionally, the inverted growth reactor chamber includes a U-shape. The inverted growth reactor chamber can include one of quartz, carbon-coated quartz, and pyrolytic boron nitride. The preparing step can further include positioning one of CZT and CdTe seed crystals in a seed pocket in the inverted growth reactor chamber; positioning raw material including one of CZT and CdTe in the inverted growth reactor chamber; filling the inverted growth reactor chamber with a solvent fluid; and pressurizing the inverted growth reactor chamber such that the solvent fluid becomes supercritical. Optionally, the heating step further includes performing one of moving the inverted growth reactor chamber within a furnace to apply heat and moving a heating element of the furnace relative to the inverted growth reactor chamber. Alternatively, the cooling step further includes slowly cooling one of CZT and CdTe crystals to room temperature thereby forming one of CZT and CdTe crystals substantially free of inclusions. Optionally, the preparing step further includes positioning raw material including one of CZT and CdTe in the inverted growth reactor chamber; filling the inverted growth reactor chamber with a solvent fluid; and pressurizing the inverted growth reactor chamber such that the solvent fluid becomes supercritical.

In another exemplary embodiment, a method of making a crystal includes synthesizing CdZnTe polycrystalline material using a two-temperature vapor transport method; weighing from about 4N to about 7N purities of Cd, Zn, and Te in accordance with the stoichiometry of CdZnTe; obtaining an inverted growth reactor chamber configured to grow inclusion free crystals; loading the CdZnTe polycrystalline materials into the inverted growth reactor chamber for single-crystal growth; filling a seed pocket, inverted growth reactor chamber, and long thin section of the inverted growth reactor chamber with CdZnTe melt; heating the inverted growth reactor chamber; and cooling the CdZnTe melt in the inverted growth reactor chamber slowly to room temperature. The inverted growth reactor chamber can include a first elongated section; a second elongated section with the seed pocket for CZT seed crystals; and a common section between the first elongated section and the second elongated section with one of molten CZT and molten CdTe. Optionally, the inverted growth reactor chamber includes a U-shape. The inverted growth reactor chamber can include one of quartz, carbon-coated quartz, and pyrolytic boron nitride. The heating step can include performing one of moving the inverted growth reactor chamber within a furnace to apply heat and moving a heating element of the furnace relative to the inverted growth reactor chamber. The cooling can include slowly cooling CZT crystals to room temperature thereby forming CZT crystals substantially free of Te inclusions.

In yet another exemplary embodiment, one of cadmium zinc tellurium (CZT) and cadmium tellurium (CdTe) crystals substantially free of inclusions is formed by the process including the steps of providing an inverted growth reactor chamber for growing one of CZT and CdTe crystals; preparing the inverted growth reactor chamber for growing one of CZT and CdTe crystals; heating the inverted growth reactor chamber; cooling the inverted growth reactor chamber thereby growing one of CZT and CdTe crystals; and removing the one of CZT and CdTe crystals from the inverted growth reactor chamber. The inverted growth reactor chamber can include a first elongated section; a second elongated section with a seed pocket for one of CZT and CdTe seed crystals; and a common section between the first elongated section and the second elongated section with one of molten CZT and molten CdTe. The first elongated section, the second elongated section, and the common section can form a U shape. Optionally, the preparing step includes positioning raw material including one of CZT and CdTe in the inverted growth reactor chamber; filling the inverted growth reactor chamber with a solvent fluid; and pressurizing the inverted growth reactor chamber such that the solvent fluid becomes supercritical. Alternatively, the heating step includes performing one of moving the inverted growth reactor chamber within a furnace to apply heat and moving a heating element of the furnace relative to the inverted growth reactor chamber. The cooling can further include slowly cooling one of CZT and CdTe crystals to room temperature thereby forming one of CZT and CdTe crystals substantially free of inclusions.

BRIEF DESCRIPTION OF THE DRAWINGS

The present invention is illustrated and described herein with reference to the various drawings, in which like reference numbers denote like method steps and/or system components, respectively, and in which.

DETAILED DESCRIPTION OF THE INVENTION

In various exemplary embodiments, the present invention provides systems and methods for crystal growth of cadmium zinc tellurium (CZT) and cadmium tellurium (CdTe) crystals with an inverted growth reactor chamber. The inverted growth reactor chamber enables growth of single, large, high purity CZT and CdTe crystals that can be used, for example, in radiation detection or the like. The inverted growth reactor chamber enables reductions in the presence of Te inclusions that are now recognized as an important limiting factor in using CZT or CdTe as radiation detectors. The inverted growth reactor chamber can be utilized with existing crystal growth techniques such as the Bridgman crystal growth mechanism and the like. In an exemplary embodiment, the inverted growth reactor chamber includes a U-shaped ampoule.

Figure 1:
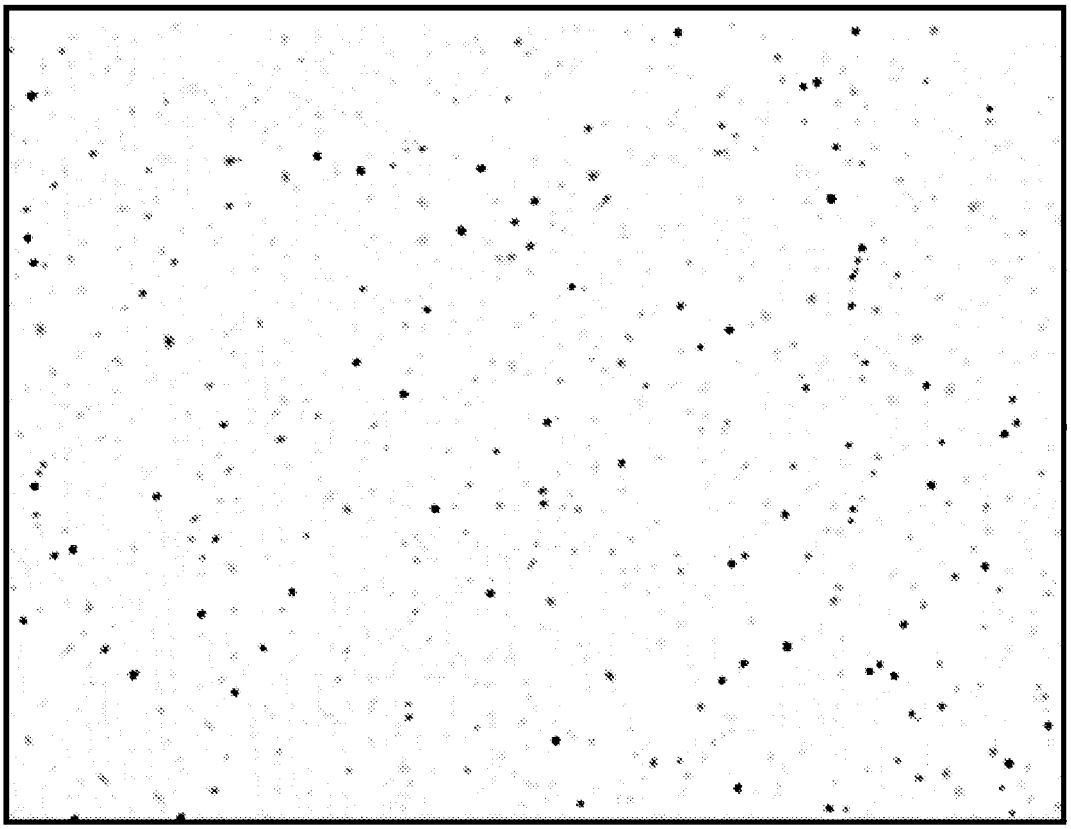
FIG. 1 illustrates a magnified image of typical Te inclusions.
Figure 2:
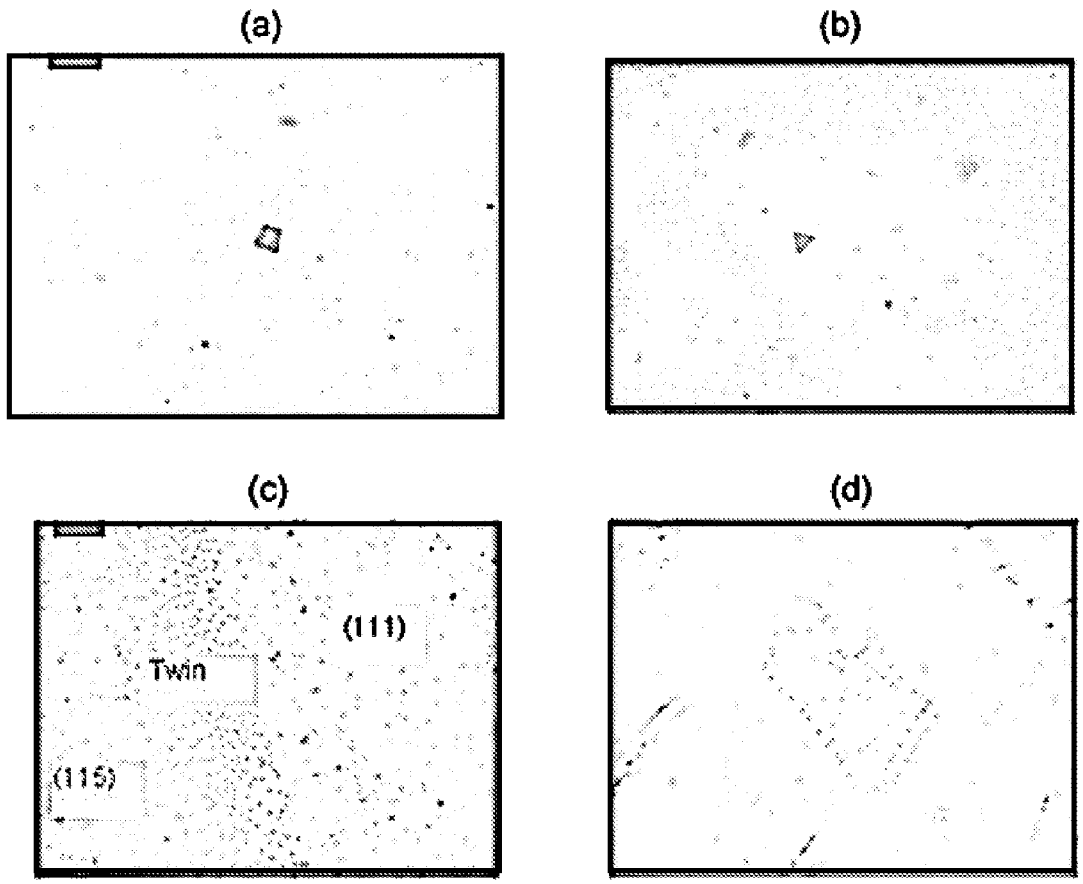
FIG. 2 illustrates the shapes of typical Te inclusions in different orientations and structures (a) illustrates a big Te inclusion of a square shape; (b) illustrates a Te inclusion with a triangular shape; (c) illustrates linear formations of Te inclusions; (d) illustrates Te inclusions incorporated inside a twin boundary.
Figure 3:
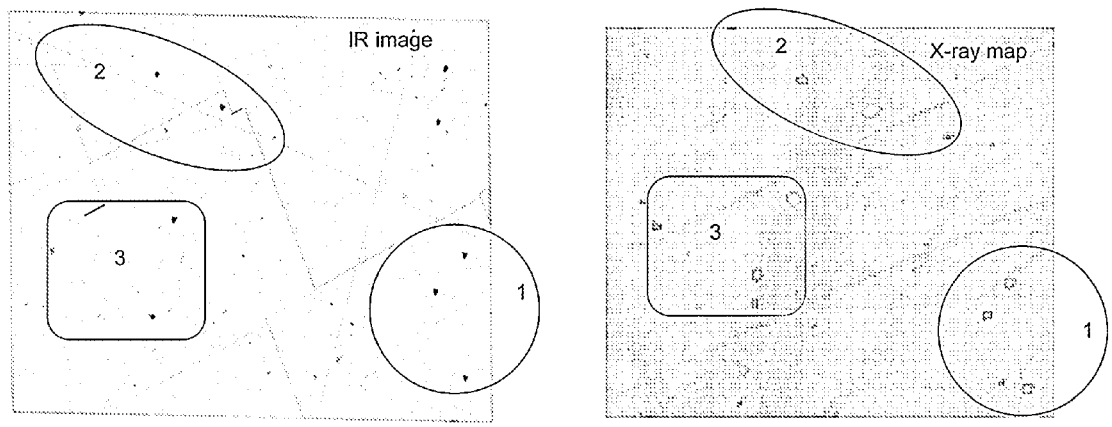
FIG. 3 illustrates the correlation between Te inclusions and degraded zones displaying poor charge collections.
Figure 4:
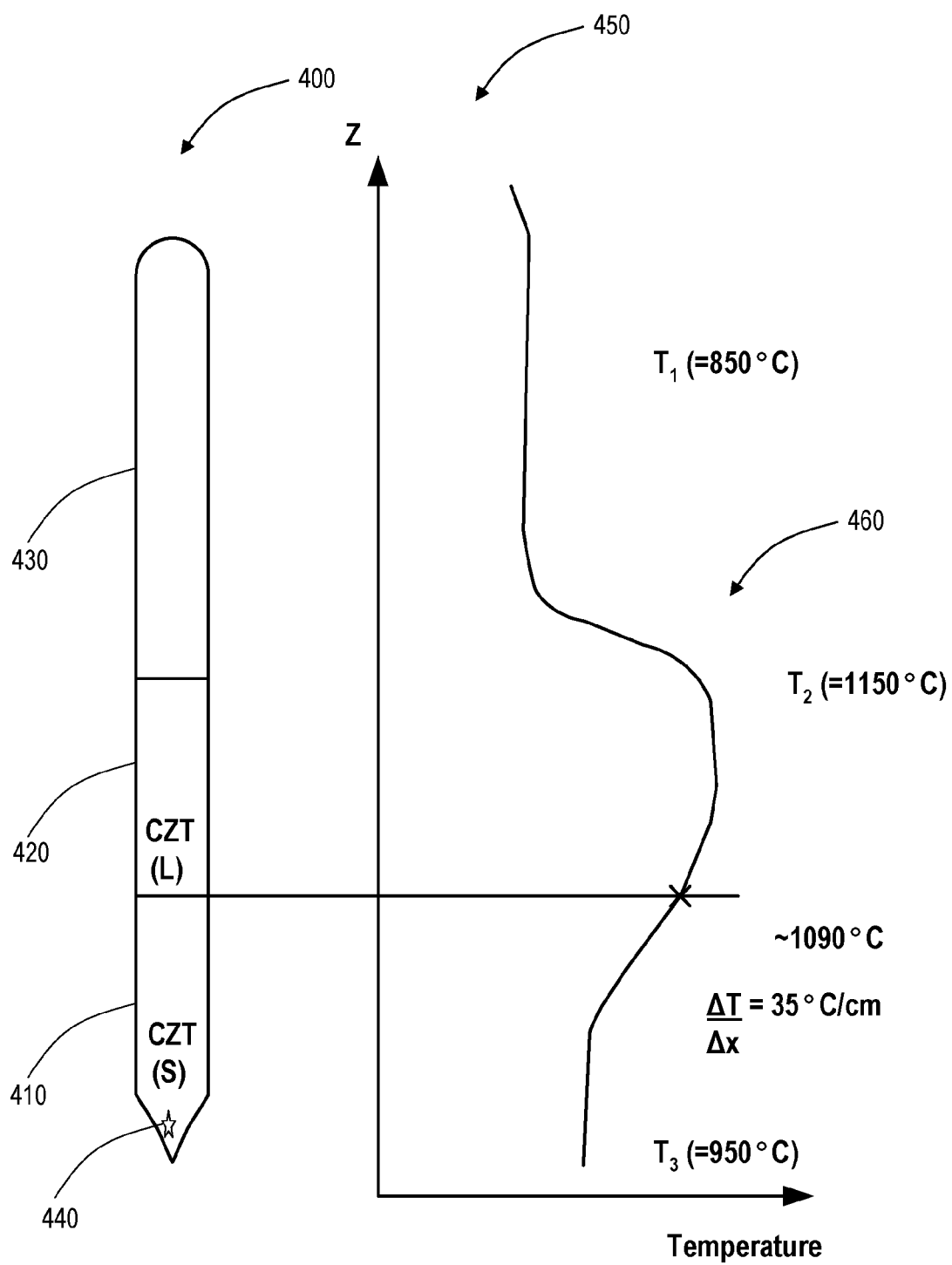
FIG. 4 illustrates a schematic of a conventional Bridgman crystal growth method.

Referring specifically to the drawings, FIG. 4 shows a schematic of a conventional Bridgman crystal growth mechanism. This is the mechanism most often employed for growth of commercial CZT crystals. The Bridgman technique is a mechanism of growing single crystal ingots or boules commonly known to one of ordinary skill in the art. It is the most popular method of producing CZT crystals. The conventional Bridgman crystal growth mechanism includes a reactor chamber 400 with at least three zones 410, 420, 430. Solid CZT is in the bottom zone 410, liquid CZT is above the bottom zone in the middle zone 420, and a Cd-rich gas is in the empty volume in the top zone 430. A seed crystal 440 is located in the bottom zone 410. The seed crystal 440 is located at the bottom of the tapered ampoule and composed of CZT or CdTe. It is used to initiate nucleation of single-crystal material at the early phase of growth. During growth the liquid material crosses over a negative temperature gradient, and solidification occurs.

A graph 450 illustrates a temperature profile 460 within the reactor chamber 400. In the modified Bridgman mechanism, a source of Cd (or $Cd_{1-x}Zn$) is heated in the top volume (zone 430) to generate an overpressure of Cd and help to reduce the Cd evaporation from the melt. In practice, it has been nearly impossible to precisely control the equilibria between the Cd in the vapor and melt and the Cd between the liquid and solid by using gas overpressures created by a heated Cd source located at the top of the ampoule. The mechanism involves heating polycrystalline material in a reactor chamber 400 above its melting point and slowly cooling it from one end of the container where the seed crystal 440 is located, as illustrated by the temperature profile 460. Single crystal material is progressively formed along the length of the reactor chamber 400. The process can be carried out in a horizontal or vertical geometry.

A similar growth technique, the high-pressure Bridgman method, is also designed to reduce evaporation of the volatile melt components by using very high overpressures. Typically, argon is used as the gas at a pressure of about 100 ATM. However, any inert gas can be used. An inert gas is any gas that does not substantially react with the materials being processed in the vessel. For example, the gas can be a noble gas (e.g., argon, helium, etc.), nitrogen, as well as gases that are normally reducing, such as hydrogen, forming gas, etc. The gas chosen should not be reactive with the materials being processed. Although the pressure of Ar gas can be well controlled, the evaporation of cadmium cannot be effectively controlled, and the pressures of cadmium vapor at different regions are remarkably different in a non-uniform temperature field. Thus, it is very difficult to obtain high-quality, uniform, inclusion-free and stoichiometric CZT crystals by this growth technique.

When growing CZT single crystals by the typical melt mechanisms, there is always surplus space in the top zone 430 of the reactor chamber 400 above the melt. In the CZT crystal growth process, cadmium evaporates from the melt and exists in the form of vapor within the top zone 430 of the reactor chamber 400. The evaporation and subsequent condensation of cadmium disturbs the stoichiometric composition of the CZT melt, causing the melt to become increasingly tellurium rich. Since the vapor pressure of tellurium is much lower than that of cadmium, the effects of tellurium vapor in the gas and of elemental cadmium in the melt can be ignored (i.e., for stoichiometric starting materials). This tellurium-rich melt is the ultimate cause of the Te inclusions present in CZT detectors produced by conventional commercial processes; consequently, growers must effectively control the composition of the melt to produce high-quality, inclusion-free crystals. Post-growth thermal annealing in a Cd overpressure is helpful to reduce the size of the Te inclusions in the as-grown crystals, but the residual damage caused by the Te-rich inclusions remain after thermal annealing.

It appears that the Te-rich CZT melt decomposes into regions of stoichiometric CZT and Te-rich clusters. Recently, the anomalous temperature dependence of liquid Te density was determined, which shows that liquid Te has a maximum density at the temperature above the melting point. Because of the density of stoichiometric CZT (Zn is slightly less than the density of liquid Te), there is a tendency for the Te-rich regions to sink over time toward the bottom of the melt, creating a gradient of Te-rich CZT in the melt. The highest degree of Te richness exists near the liquid-solid interface between bottom zone 410 and middle zone 420, because the segregated Te stops at the liquid-solid interface. Small micron-size droplets of segregated Te from the Te-rich melt deposit on the growth surface, which creates instabilities at the growth interface. More importantly, the Te-rich melt separates Te continuously throughout the process, repeatedly depositing droplets from the melt onto the growing interface. This deposit of Te-rich clusters at the liquid-solid interface gives rise to regions in the CZT ingot with a dispersed secondary phase of Te, which is now known to seriously affect the quality of the crystal for radiation detection.

During the growth of CZT single crystals by the vertical Bridgman method, the Te-rich melt continuously deposits micron-scale Te clusters at the liquid-solid interface due to the higher density of Te. Since the crystal growth direction is upward and the Te deposition is downward, there is no way to avoid the inclusion of segregated Te throughout the growth process for a Te-rich melt. Similarly, it is comparably difficult to obtain inclusion-free CZT crystals using the horizontal Bridgman and other zone melting growth mechanisms, because of the perpendicular nature of the directions of crystal growth and the deposition of segregated Te-rich clusters from the melt. FIG. 4 illustrates the temperature profile 460, generated by the typical vertical Bridgman method, within a standard, non-inverted growth reactor chamber.

Crystals are structures that are formed from a regular repeated pattern of connected atoms or molecules. Crystals grow by a process termed nucleation. During nucleation, the atoms or molecules that crystallize (solute) are dissolved into their individual units in a solvent. The solute particles contact each other and connect with each other. This subunit is larger than an individual particle, so more particles can contact and connect with it. Eventually, this crystal nucleus becomes large enough that it falls out of solution (crystallizes). Other solute molecules continue to attach to the surface of the crystal, causing it to grow until a balance or equilibrium is reached between the solute molecules in the crystal and those that remain in the solution.

Growing a crystal requires a solution that maximizes the chances for the solute particles to come together and form a nucleus, which grows into the crystal. Crystallization requires a concentrated solution with as much solute as can be dissolved (saturated solution). Nucleation can occur simply through the interactions between the solute particles in the solution (called unassisted nucleation), but sometimes it is better to provided a meeting place for solute particles to aggregate (assisted nucleation). A rough surface tends to be more attractive for nucleation than a smooth surface. As an example, a crystal is more likely to start forming on a rough piece of string than on the smooth side of a glass. A seed crystal can also be utilized to initiate nucleation of single-crystal growth. The advantages of inverted growth described herein apply to both seeded and unseeded (heterogeneous nucleation) growth. For seeded growth a single-crystal CZT or CdTe seed could be used.

In various exemplary embodiments, the present invention utilizes an inverted crystal growth method and an inverted growth reactor chamber. The inverted growth reactor chamber can be a U-shape ampoule or the like. Inverted growth in the present invention causes the high-density particles in the melt to drop away from the growing interface by buoyancy. Buoyant forces are completely driven by gravitational force. As described herein, tellurium inclusions, in particular, have a high density and are detrimental to the functioning of the crystal for radiation detection. The shape of the inverted growth reaction chamber is important, because the liquid is kept in constant contact with the solidified portion of the ingot. Without the inverted shape or some other pressure that could be applied to the melt, forcing it in the opposite direction of the growth, the melt simply separates from contact with the partially solidified ingot. This separation is disruptive to the growth of large single crystals.

Figure 5:
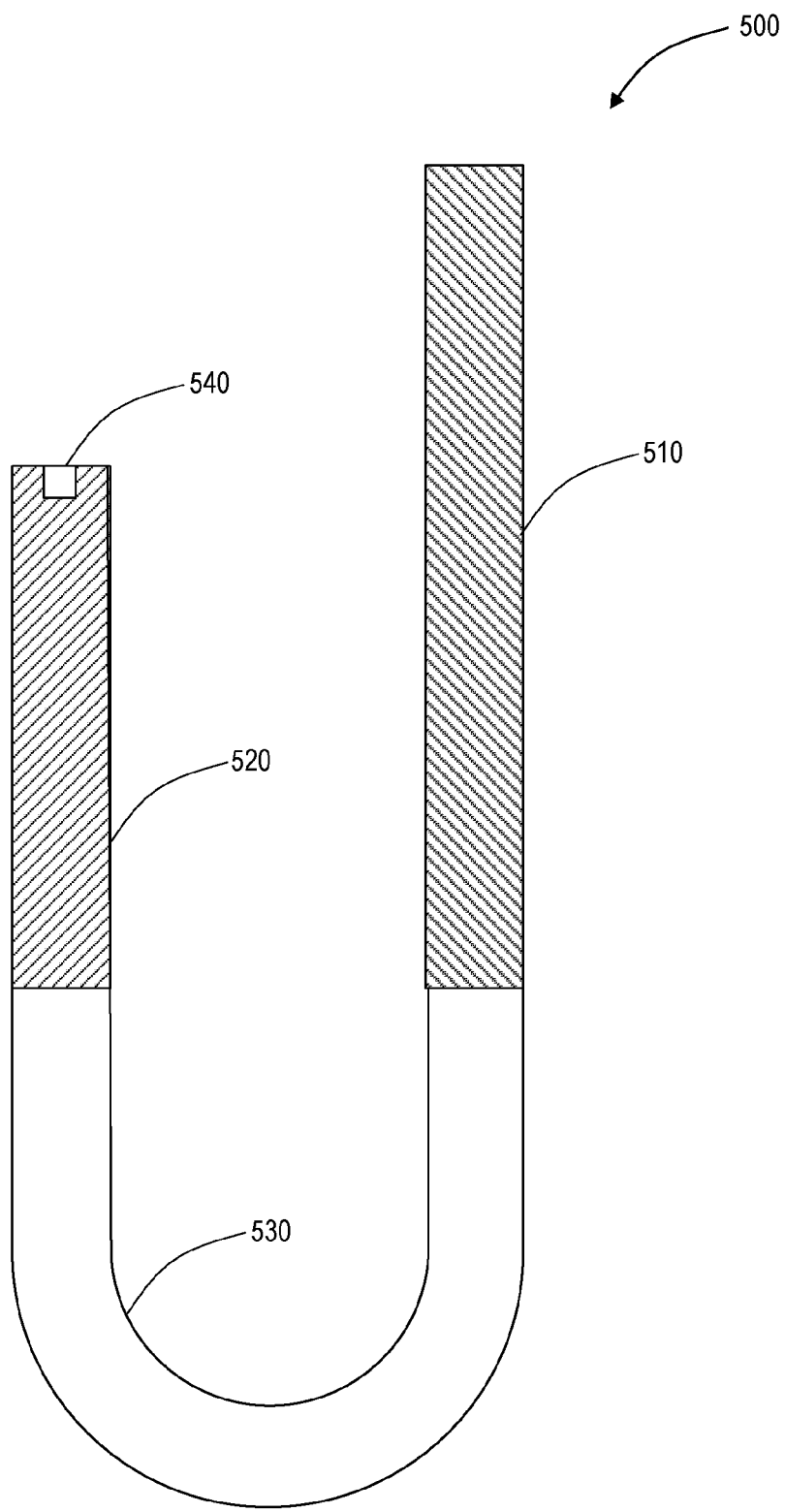
FIG. 5 illustrates a schematic diagram of an inverted growth reaction chamber for cadmium zinc tellurium (CZT) and cadmium tellurium (CdTe) crystals according to an exemplary embodiment of the present invention.

FIG. 5 illustrates an inverted growth reactor chamber 500 according to an exemplary embodiment of the present invention. The inverted growth reactor chamber 500 includes a first elongated section 510, a second elongated section 520, and a common section 530 between the first elongated section 510 and the second elongated section 520. The end of the first elongated section 510 not coupled with the common section 530 and the end of the second elongated section 520 not coupled with the common section 530 can either be open or closed. The inverted growth reactor chamber 500 can also include an optional seed pocket 540 that can be located in the first elongated section 510 or the second elongated section 520. In most cases the seed pocket 540 is located in the second elongated section 520. The seed pocket 540 is placed at the first-to-freeze section of the ingot to initiate single-crystal growth along the side of the seed facing the melt. In an exemplary embodiment, the inverted growth reactor chamber 500 includes a U-shape ampoule although the present invention contemplates other shapes for providing inverted growth of CZT or CdTe. The inverted growth reactor chamber 500 can include a carbon-coated quartz ampoule or the like.

In an exemplary embodiment of the present invention the chamber 500 can be used to contain the solid polycrystalline CZT or other suitable starting material. Conventional furnace heating elements apply heat to melt the common section 530 all the way up to the seed crystal and to a comparable height on the other side of the U-shape ampoule. The solid (not melted) polycrystalline material in first elongated section 510 provides a pressure on the melt in the common section 530 to maintain contact between the seed 540 and the melt in the common section 530. The second elongated section 520 can be used as the CZT crystal growth region. By controlling the heat applied by the furnace heating elements, the melt in common section 530 that is in contact with the seed in seed pocket 540 solidifies as crystal growth commences. The volume of the second elongated section 520 grows downward with continued growth of the ingot. The common section 530 can be used to hold the liquid crystal melt. The shape of the common section 530 allows the Te-rich clusters to sink to the bottom of the common section 530 instead of depositing on the growing crystal at the bottom of the second elongated section 520.

CZT polycrystalline material is synthesized first using a two-temperature vapor transport method. In this method two compounds are located in two separated regions inside a sealed ampoule or two interconnected vessels. During the synthesis the temperatures inside the regions, containing the initially separated materials, are maintained at certain temperatures, while the materials are slowly evaporated and mixed in a controlled rate. R. T. Lynch, "Vapor growth of cadmium telluride single crystals", J. Appl. Phys., 33, pp. 1009-1011, 1962. Liu Hongtao, Sang Wenbin, Min Jiahua and Zhan Feng, "Purification of $Cd_{0.9}Zn_{0.1}Te$ by physical vapor transport method", Materials Letters, 59, pp. 3837-3840, 2005. For high-purity crystals, about 6N or 7N purities of Cd, Zn and Te are weighed in accordance with the stoichiometry of the CZT. The subject invention also applies to low-purity CdZnTe and CdTe. The synthesized CZT polycrystalline materials are loaded into the custom-designed inverted growth reactor chamber 500. Advantageously, the inverted growth reactor chamber 500 provides a novel design for growing CZT and CdTe crystals and is compatible with existing crystal growth furnace mechanisms such as the Bridgman furnace.

Figure 6:
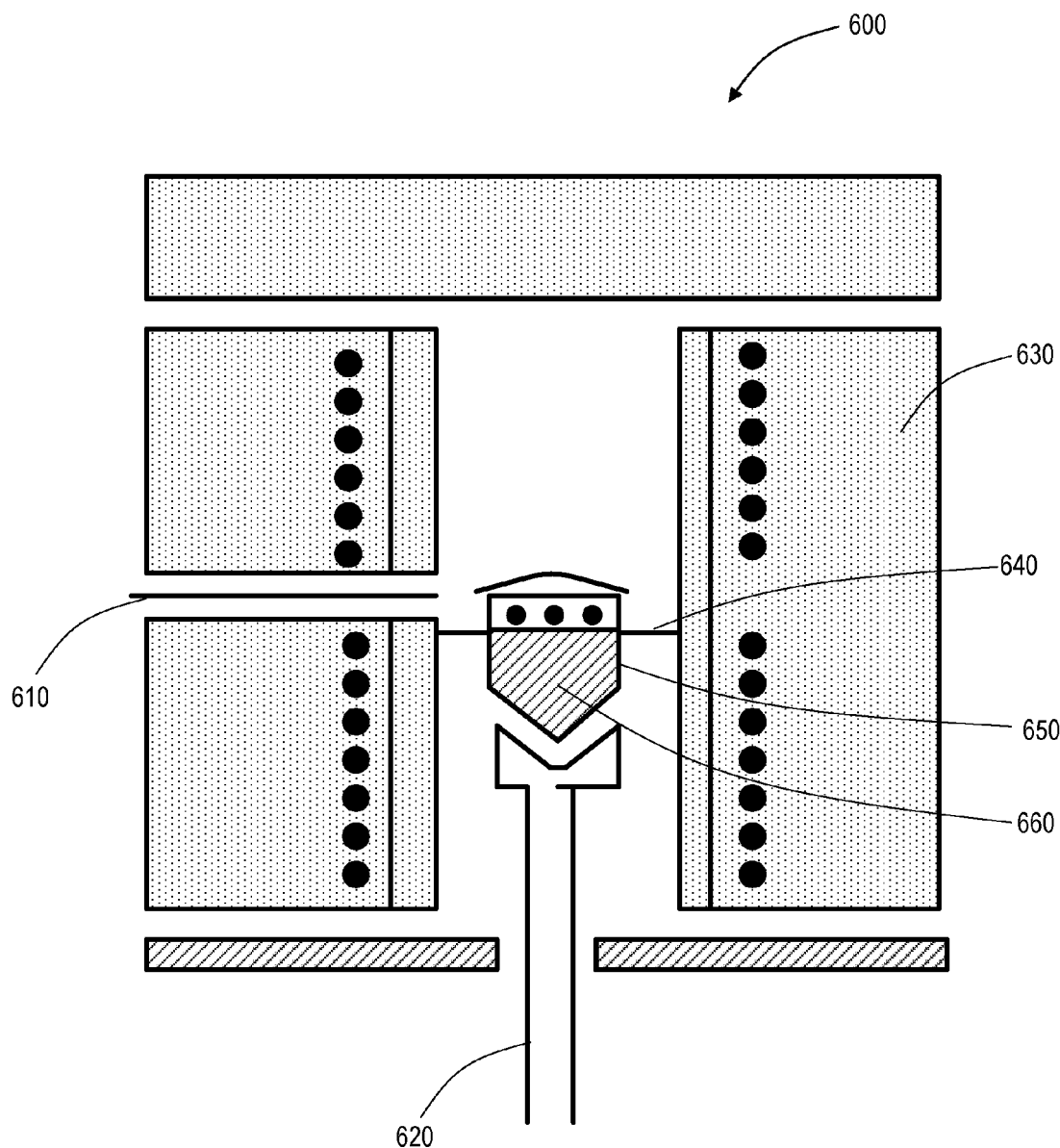
FIG. 6 illustrates a typical furnace setup for the Bridgman crystal growth method.

CZT or CdTe crystal growth can be carried out in either a single zone or multi-zone vertical tubular furnace. The furnace can include a Bridgman furnace, but other furnace designs are also contemplated by the present invention. An example of a typical Bridgman furnace setup 600 is illustrated in FIG. 6. The typical Bridgman furnace setup 600 includes a thermocouple 610, a refrigerant 620, a heating element 630, a heat shield 640, an optional seed pocket 660 located at the bottom, and a crucible 650.

In the present invention, the thermal gradient can be applied in such a way to invert the normal growth direction of crystal growth. The inverted growth reactor chamber 500 can be used for keeping the liquid in contact with the solid during the inverted growth. Several variations of the inverted growth reactor chamber such as a "U" shape, "J" shape, "O" shape, "V" shape, or any curved variation thereof is contemplated by the present invention. In one exemplary embodiment of the present invention the reactor chamber 500 can be a U-shape ampoule. An ampoule is a tube type vessel such as a cylindrical tube. The function of an ampoule is similar to that of a crucible. The ampoule can be made from quartz, carbon-coated quartz, pyrolytic boron nitride, or any other minimally reactive substance which can withstand high heat and possesses the desired thermal conductivity for transporting heat during growth and maintaining an appropriate shape for the melt-solid interface.

A furnace can also be called a reactor system or heater system. A typical furnace usually includes one or more heater coils, one or more thermocouples, and one or more temperature controllers for programmed thermal cycles. Thermocouples are available in different combinations of metals or calibrations. The four most common calibrations are J, K, T and E. Each calibration has a different temperature range and environment, although the maximum temperature varies with the diameter of the wire used in the thermocouple. In one embodiment of the present invention a K-type thermocouple is used. The K-type thermocouple can be made from of chromel-alumel and operates at a temperature range of −200 to 1350° C.

The solvent used for crystallization should have temperature dependent solubility so that the temperature of the solution can be reduced well below the total melt temperature. An example of this is Te as a solvent for CdTe and ZnTe. Increasing the amount of Te proportional to CdTe and ZnTe can reduce the melting point by several hundred degrees Celsius in the example of CZT. In an exemplary embodiment of the present invention, Te is used as the solvent. Other solvents can be used for growth of CZT, such as indium.

During the crystal-growth process, the seed pocket 540 and the inverted growth reactor chamber 500, or the U-shape quartz ampoule, are filled with the starting material, typically polycrystalline CZT or CdTe. Sections 520 and 530 are heated to a molten state and allowed to slowly cool with the coldest section in contact with the seed. Because of the relatively high density of CZT, it is possible to remove the surplus space in the seed pocket 540 by adjusting the height of the CZT melt. Thus, the decomposition of the CZT melt can be completely suppressed, and the evaporation of Cd can be prevented. Furthermore, the Te-rich clusters in the melt, which normally sink and deposit at the liquid-solid interface of the growing crystal, now sink away from the liquid-solid interface.

The first elongated section 510 fills with molten cadmium zinc telluride which acts as a tamp to keep the molten CZT from separating away from the solid. The heating element creates the molten state by melting the solid polycrystalline material that had previously been filled into the ampoule. The material which was not heated to its molten state acts as a tamp. This design can be applied to other methods as well. For example, a high pressure inert gas such as Argon can be used. Any gas can function as a tamp as long as it does not chemically react or dissolve in the molten or solid CZT or ampoule material. The gas used must not create a type of flow in the melt that disrupts single crystal growth. For example, the gas can be a noble gas (i.e. argon, helium, etc.), nitrogen, as well as gases which are normally reducing, such as hydrogen, forming gas, etc.

When the reactor chamber 500 is pulled upward, the CZT or CdTe crystal grows downward, and the directions of the crystal growth and the sinking of the segregated Te-rich regions are both in the downward direction. If the reactor chamber 500 is held stationary, and cannot be pulled upward, then the heating element of the furnace can be moved so that the hot-zone moves downward during solidification, thus creating a cooler zone at the liquid-solid interface (compared to the melt) at the bottom of section 520. Either way, the lower portion of the ingot is the melt-solid interface, and the solidification is in the downward direction resulting in inverted growth. In this way the segregated Te-rich regions, which are continuously formed in the melt as Cd is lost to the vapor, sink away from the growing crystal and cause no instabilities in the growth process. When the solidification is complete, the crystal is slowly cooled to room temperature. The crystal growth parameters used for this new growth process are close to those reported in literature for conventional CZT Bridgman growth. This innovative, yet simple approach, for growth of CZT is completely new, and represents a potential solution to the problems with Te-rich inclusions in CZT detectors.

Figure 7:
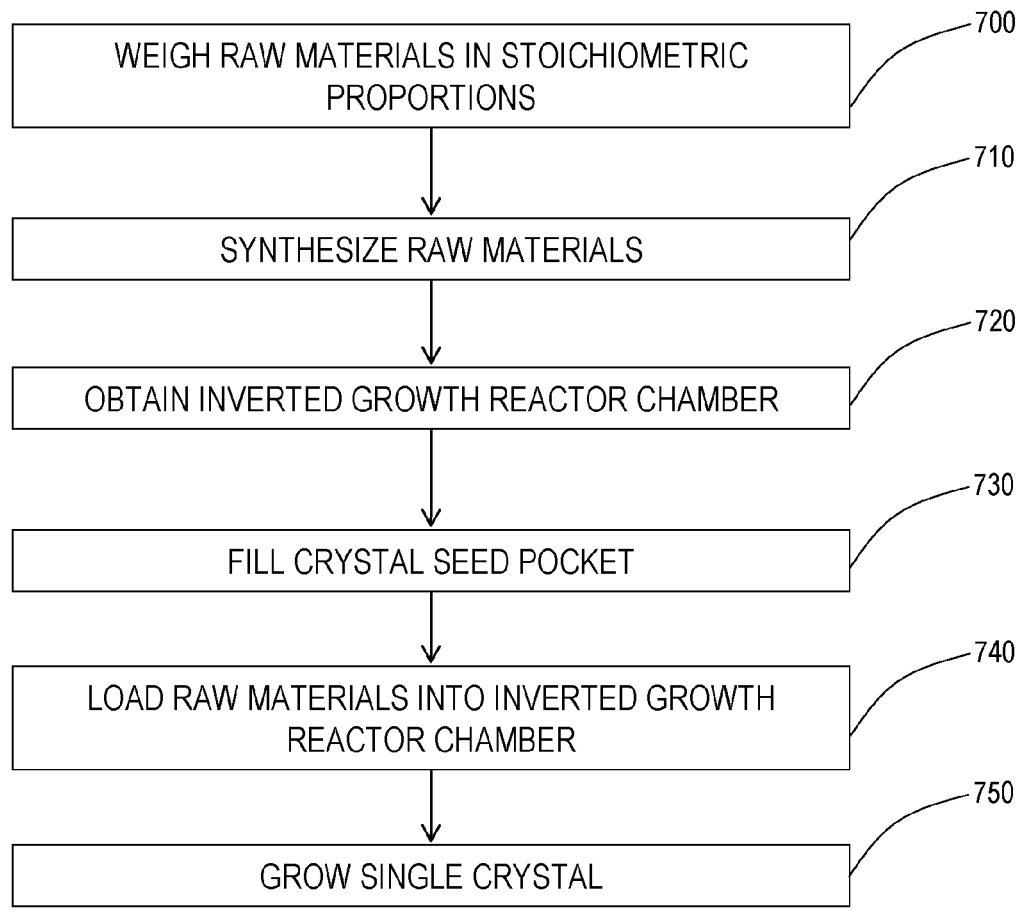
FIG. 7 illustrates a flowchart of the steps of the single crystal inverted growth method according to an exemplary embodiment of the present invention.

FIG. 7 illustrates an overview of a single crystal inverted growth method. Step one 700 involves weighing Cd, Zn, and Te of about 4N purity (99.99%), about 5N purity (99.999%), about 6N purity (99.9999%), or a higher purity in accordance with the stoichiometry of CdTe and ZnTe. Step two 710 involves synthesizing CdTe and ZnTe polycrystalline raw materials using a two-temperature vapor transport method. In this method two compounds are located in two separated regions inside a sealed ampoule or two interconnected vessels. During the synthesis the temperatures inside the regions, containing the initially separated materials, are maintained at certain temperatures, while the materials are slowly evaporated and mixed in a controlled rate. R. T. Lynch, "Vapor growth of cadmium telluride single crystals", J. Appl. Phys., 33, pp. 1009-1011, 1962. Liu Hongtao, Sang Wenbin, Min Jiahua and Zhan Feng, "Purification of $Cd_{0.9}Zn_{0.1}Te$ by physical vapor transport method", Materials Letters, 59, pp. 3837-3840, 2005

Step three 720 involves procuring an inverted growth chamber capable of producing a single crystal by inverted growth. For seeded growth, step four 730 involves loading a crystal seed into the seed pocket. The crystal seed can be CZT, CdTe or any CZT alloy composition similar to the stoichiometry of the melt. For unseeded growth step four 730 is eliminated. Step five 740 involves loading the measured, raw material into the inverted growth reactor chamber. Step six 750 involves slowly cooling the melt to room temperature and allowing the single crystal to form via inverted growth. The temperature of the overall system varies during growth and cool-down.

Although the present invention has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present invention and are intended to be covered by the following claims.

What is claimed is:

1. A method for growing one of Cadmium Telluride (CdTe) and Cadmium Zinc Telluride (CZT) crystal, comprising:
   providing a inverted growth reactor chamber for growing one of CZT and CdTe crystals;
   positioning one of CZT and CdTe seed crystals in a seed pocket in the inverted growth reactor chamber;

positioning raw material comprising one of CZT and CdTe in the inverted growth reactor chamber;

filling the inverted growth reactor chamber with a solvent fluid; and pressurizing the inverted growth reactor chamber such that the solvent fluid becomes supercritical;

heating the inverted growth reactor chamber; and cooling the inverted growth reactor chamber thereby growing one of the CZT and CdTe crystals.

2. The method of claim 1, wherein the inverted growth reactor chamber comprises:

a first elongated section;

a second elongated section comprising a seed pocket for one of CZT and CdTe seed crystals; and a common section between the first elongated section and the second elongated section comprising one of molten CZT and molten CdTe.

3. The method of claim 2, wherein the inverted growth reactor chamber comprises a U-shape.

4. The method of claim 2, wherein the inverted growth reactor chamber comprises one of quartz, carbon-coated quartz, and pyrolytic boron nitride.

5. The method of claim 1, wherein the heating step further comprises:

performing one of moving the inverted growth reactor chamber within a furnace to apply heat and moving a heating element of the furnace relative to the inverted growth reactor chamber.

6. The method of claim 1, wherein the cooling step further comprises slowly cooling one of CZT and CdTe crystals to room temperature thereby forming one of CZT and CdTe crystals substantially free of inclusions.

7. The method of claim 1, wherein the preparing step further comprises:

positioning raw material comprising one of CZT and CdTe in the inverted growth reactor chamber;

filling the inverted growth reactor chamber with a solvent fluid; and pressurizing the inverted growth reactor chamber such that the solvent fluid becomes supercritical.

8. A method of making a crystal, comprising:

synthesizing CdZnTe polycrystalline material using a two-temperature vapor transport method;

weighing from about 4N to about 7N purities of Cd, Zn, and Te in accordance with the stoichiometry of CdZnTe;

obtaining an inverted growth reactor chamber configured to grow inclusion free crystals;

loading the CdZnTe polycrystalline materials into the inverted growth reactor chamber for single-crystal growth;

filling a seed pocket, inverted growth reactor chamber, and long thin section of the inverted growth reactor chamber with CdZnTe melt;

heating the inverted growth reactor chamber; and cooling the CdZnTe melt in the inverted growth reactor chamber slowly to room temperature.

9. The method of claim 8, wherein the inverted growth reactor chamber comprises:

a first elongated section;

a second elongated section comprising the seed pocket for CZT seed crystals; and a common section between the first elongated section and the second elongated section comprising one of molten CZT and molten CdTe.

10. The method of claim 9, wherein the inverted growth reactor chamber comprises a U-shape.

11. The method of claim 9, wherein the inverted growth reactor chamber comprises one of quartz, carbon-coated quartz, and pyrolytic boron nitride.

12. The method of claim 8, wherein the heating step further comprises:

performing one of moving the inverted growth reactor chamber within a furnace to apply heat and moving a heating element of the furnace relative to the inverted growth reactor chamber.

13. The method of claim 8, wherein the cooling further comprises slowly cooling CZT crystals to room temperature thereby forming CZT crystals substantially free of Te inclusions.

14. One of cadmium zinc tellurium (CZT) and cadmium tellurium (CdTe) crystals substantially free of inclusions formed by the process comprising the steps of:

providing an inverted growth reactor chamber for growing one of CZT and CdTe crystals;

preparing the inverted growth reactor chamber for growing one of CZT and CdTe crystals wherein this preparing step further comprises:

positioning raw material comprising one of CZT and CdTe in the inverted growth reactor chamber;

filling the inverted growth reactor chamber with a solvent fluid; and pressurizing the inverted growth reactor chamber such that the solvent fluid becomes supercritical;

heating the inverted growth reactor chamber;

cooling the inverted growth reactor chamber thereby growing one of CZT and CdTe crystals; and removing the one of CZT and CdTe crystals from the inverted growth reactor chamber.

15. The cadmium zinc tellurium (CZT) and cadmium tellurium (CdTe) crystals of claim 14, wherein the inverted growth reactor chamber comprises:

a first elongated section;

a second elongated section comprising a seed pocket for one of CZT and CdTe seed crystals; and a common section between the first elongated section and the second elongated section comprising one of molten CZT and molten CdTe.

16. The cadmium zinc tellurium (CZT) and cadmium tellurium (CdTe) crystals of claim 15, wherein the first elongated section, the second elongated section, and the common section form a U shape.

17. The cadmium zinc tellurium (CZT) and cadmium tellurium (CdTe) crystals of claim 14, wherein the heating step further comprises:

performing one of moving the inverted growth reactor chamber within a furnace to apply heat and moving a heating element of the furnace relative to the inverted growth reactor chamber.

18. The cadmium zinc tellurium (CZT) and cadmium tellurium (CdTe) crystals of claim 14, wherein the cooling further comprises slowly cooling one of CZT and CdTe crystals to room temperature thereby forming one of CZT and CdTe crystals substantially free of inclusions.

* * * * *